(12) United States Patent
Song et al.

(10) Patent No.: US 6,838,637 B2
(45) Date of Patent: Jan. 4, 2005

(54) METHOD AND APPARATUS FOR DEFLASHING OF INTEGRATED CIRCUIT PACKAGES

(75) Inventors: Wen Dong Song, Singapore (SG); Minghui Hong, Singapore (SG); Chengwu An, Singapore (SG); Yong Feng Lu, Singapore (SG)

(73) Assignee: Data Storage Institute, Singapore (SG)

( * ) Notice: Subject to any disclaimer, the term of this patent is extended or adjusted under 35 U.S.C. 154(b) by 0 days.

(21) Appl. No.: 10/059,940

(22) Filed: Jan. 29, 2002

(65) Prior Publication Data

US 2003/0062347 A1 Apr. 3, 2003

(51) Int. Cl.$^7$ .............................................. B23K 26/00
(52) U.S. Cl. .......................... 219/121.72; 219/121.68; 219/121.69
(58) Field of Search ....................... 219/121.72, 121.67, 219/121.68, 121.69, 121.85

(56) References Cited

U.S. PATENT DOCUMENTS

| | | | |
|---|---|---|---|
| 4,803,021 A | * | 2/1989 | Werth et al. ................. 264/400 |
| 4,857,699 A | | 8/1989 | Duley et al. |
| 5,099,101 A | * | 3/1992 | Millerick et al. ...... 219/121.82 |
| 5,164,565 A | | 11/1992 | Addiego et al. |
| 5,227,608 A | | 7/1993 | Yoshida et al. |
| 5,841,099 A | | 11/1998 | Owen et al. |
| 5,934,195 A | | 8/1999 | Rinke et al. |
| 5,961,860 A | * | 10/1999 | Lu et al. ................. 219/121.65 |
| 6,468,356 B1 | * | 10/2002 | Crema et al. ................... 134/1 |
| 6,576,867 B1 | * | 6/2003 | Lu et al. ................. 219/121.69 |

FOREIGN PATENT DOCUMENTS

| | | | |
|---|---|---|---|
| WO | WO 99/30844 | * | 6/1999 |
| WO | WO 99/65061 | * | 12/1999 |

* cited by examiner

Primary Examiner—M. Alexandra Elve
(74) Attorney, Agent, or Firm—John P. White; Cooper & Dunham LLP

(57) ABSTRACT

This invention relates to a method and apparatus for deflashing integrated circuit (IC) packages by laser irradiation. The method and apparatus include two lasers scanning flash area for performing deflashing operation. $CO_2$ laser is used to remove top layer of flash and YAG laser is used to remove the thin layer of flash remained after $CO_2$ laser deflashing. $CO_2$ laser deflashing and following YAG laser deflashing can effectively remove flash and avoid damage of heat sinks as well as leads and bars in the IC packages.

13 Claims, 10 Drawing Sheets

280

METHOD AND APPARATUS FOR DEFLASHING OF INTEGRATED CIRCUIT PACKAGES

This invention relates to a method and apparatus for laser deflashing of integrated circuit (IC) packages. In particular, it relates to a method and apparatus for removing flash from heat sinks as well as leads and bars in IC packages without damage.

A plastic-encapsulated microcircuit consists of an IC chip physically attached to a leadframe, electrically interconnected to input-output leads mid moulded in a plastic that is in direct contact with the chip, leadframe, and interconnects. With major advantages in cost, size, weight, performance, and availability, plastic packages have attracted 97% of the market share of worldwide microcircuit sales.

During the moulding process, it is known that moulding compound can flow through the mould parting line and onto the leads of the device. In its thinnest form, this material is known as resin bleed or thin flash. A thicker bleed of material is known as flash. If this material is left on the leads it will cause problems in the downstream operations of lead trimming, forming, and solder dipping and/or plating. In some cases, plastic packages are designed with an integral heat spreader exposed to air to meet high thermal and electrical performance demands. The die is attached directly to the heat spreader to minimize the thermal resistance. During the moulding process, moulding compound usually leaks out and forms flash on heat sink surfaces. This will greatly limit heat sink function and even cause damage of the plastic packages. Therefore, deflashing of IC packages is one of critical processes in the manufacturing.

Mechanical and chemical deflashing are conventional deflashing techniques in IC packaging lines. For removing resin bleed or thin flash, it is excellent to use chemical deflashing technique. Plastic packages are immersed in a chemical tank for a specified time and checked for the degree of deflashing. Effectively deflashed components are rinsed and air-dried. However, it has distinct drawbacks. First, chemical solution used for deflashing can potentially hurt component performance. Second, there is the significant cost of handling and disposing toxic materials during, and after deflashing Mechanical deflashing techniques such as suction gun, pressure gun wet blast and impeller wheel are usually used to remove flash on round leads, heat sinks and lead frames, and flash between tie bars and leads. However, it also has distinct drawbacks as shown in R. F. Zecber "Deflashing encapsulated electronic components"; Plastics Engineering, June (1985), pp. 35–38. For example, some dust is needed to clean up.

Laser deflashing as a new deflashing technique was disclosed in U.S. Pat. Nos. 5,099,101 and 5,961,860, and Singapore patent WO 00/37209. In above patents, YAG laser or excimer laser is used to remove flash. Since heat sinks as well as leads and bars are made of copper or copper substrate with metal coating layers, YAG laser or excimer laser easily induces damage of heat sinks as well as leads and bars in air at high laser fluence. Our new findings indicate that as flash especially thick flash has been removed by YAG or excimner laser ablation, the laser also induces damage such as oxidation of heat sinks as well as leads and bars. In fact, only thin flash can be removed by YAG or excimer laser deflashing at low laser fluence and pulse number without damage such as oxidation of heat sinks as well as leads and bars. Therefore, how to remove flash without damage is key issue for laser deflashing application in industry In accordance with a first aspect of the present invention there is provided a method of deflashing IC packages. The method comprises the steps of directing a first laser beam in the infra-red frequency range onto flastf area for removing top layer of flash; and subsequently directing a second pulsed laser beam onto the flash area at low laser fluence and pulse number for removing the thin layer of flash remained after application of the first laser beam.

Since heat sinks as well as leads and bars are high reflective materials to infra-red radiation, the first laser irradiation only induces low temperature rise of the heat sinks, leads and bars. In addition, the thin layer of flash remained after the first laser deflashing plays an important part in avoiding damage such as oxidation. Therefore, the damage can be effectively avoided during the first laser deflashing. when infra-red laser irradiates the flash area. The first laser can effectively remove top layer of flash especially thick flash. However, a thin layer of flash remains on heat sinks as well as leads and bars after the first laser deflashing. That means that the first laser deflashing on its own cannot meet industrial demands. To complete effective deflashing, the second laser is applied deflashing at low laser fluence and pulse number can effectively remove the thin flash remained after the first laser deflashing without damage in accordance with this invention.

The first laser may, for example, by a $CO_2$ laser. It may applied in pulses, each with a typical duration in excess of 1 $\mu$s. Alternatively, it may be applied in a continuous wave (CW) mode.

The second laser may operate over a wide spectral range, for example, from infra-red to ultra-violet. It may suitably be a YAG laser. The second laser is, most preferably, applied in short-duration pulses. It has been found that a pulse length of less than 100 ns is to be preferred to produce effective deflashing, without causing a significant and detrimental temperature rise in sensitive components, such as leads and bars, of the IC at low laser fluence and pulse number.

In accordance with a second aspect of the present invention, there is provided an apparatus for deflashing IC packages comprising: a conveyor system for carrying IC packages to appropriate position; a mask placed on IC packages for exposing flash area to laser beams; first and second lasers for generating laser beams; and a scanning system for each laser; wherein the belt conveyor is movable relative to each laser beam, the two galvanometers being used to scan respective laser beams in turn on a flash area of the IC packages.

With the present invention, the damage of heat sinks as well as leads and bars can be effectively avoided; the flash on heat sinks as well as leads and bars can be effectively removed by laser irradiation.

Apparatus embodying the invention may further comprise an exhauster for removing flash debris.

The first laser may be a $CO_2$ laser. Moreover, the first laser may be a pulsed laser or a continuous wave laser.

The second laser is typically a YAG laser. The second laser may have a wavelength of 1064 nm or 532 nm.

In typical embodiments, the second laser has predetermined pulse-duration. For example, the predetermined pulse duration is between 1 fs and 1000 ns; e.g. 7 ns.

Embodiments of the invention will now be described in detail, by way of example, and with reference to the accompanying drawings, in which:

FIG. 3b is an X-ray photoelectron spectroscopy (XPS) Cu2p spectrum of FIG. 3a;

FIG. 4b is an X-ray photoelectron spectroscopy (XPS) Cu2p spectrum of FIG. 4a;

Figure 1:
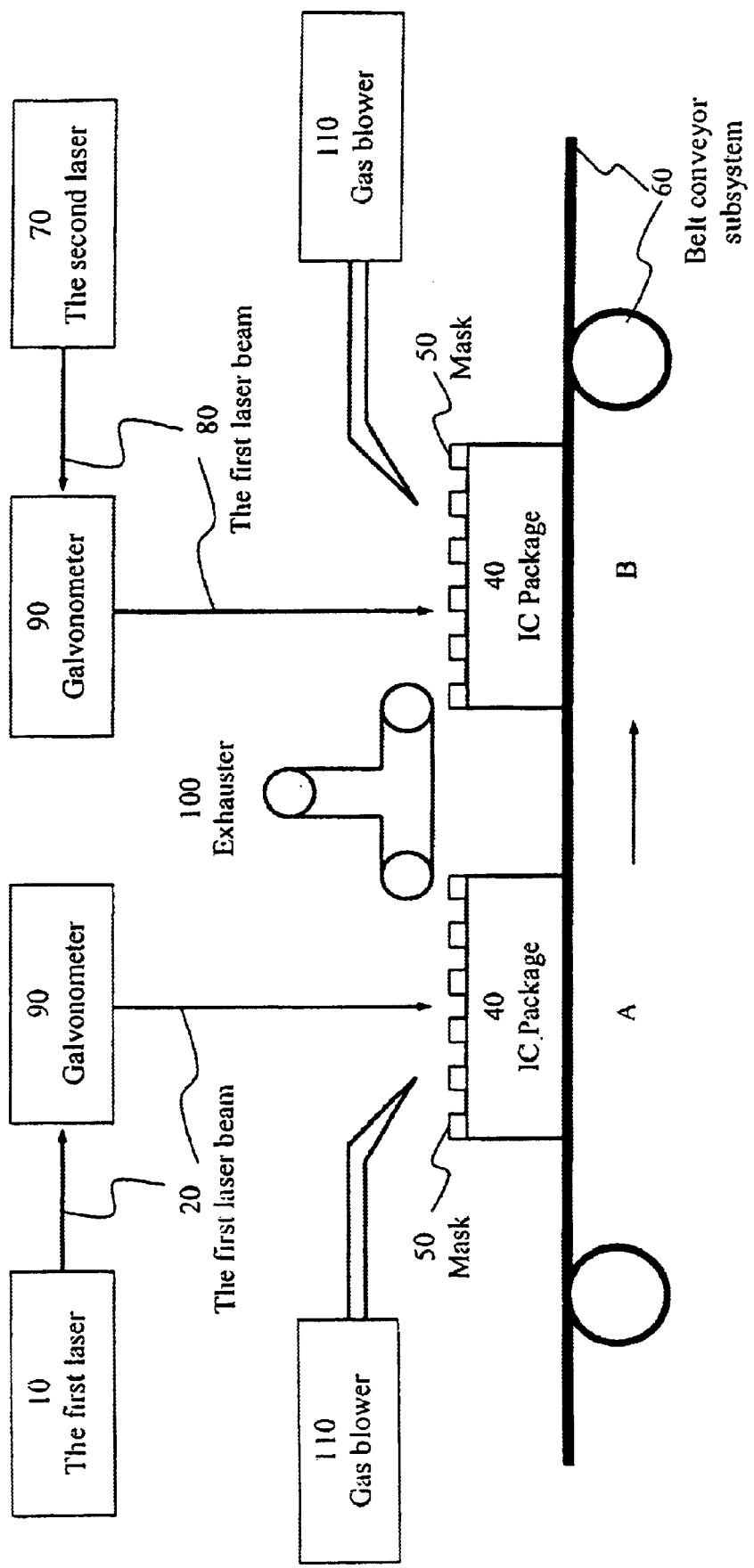
FIG. 1 is a schematic diagram showing the apparatus according to one embodiment of the present invention.

Refer now to FIG. 1. The apparatus for deflashing IC packages according to one embodiment of the present invention comprises a first laser 10. The first laser is a CO$_2$ laser that generates a laser beam 20 in the infra-red range, in this embodiment, with a wavelength of approximately 10.6 $\mu$m.

A galvanometer 30 for first laser 10 is used to scan the CO$_2$ laser beam 20 onto an IC package 40 along a predetermined path. A mask 50 is used to expose only the flash area on the IC package 40 to laser beam 20. The IC package 40 with the mask 50 is placed on belt conveyor subsystem 60. After the first laser deflashing, the IC package 40 is carried from position A to position B by the belt conveyor subsystem 60 for following a second laser deflashing operation. Meanwhile, another IC package can be carried to position A for its first laser deflashing.

A second laser 70 is in this embodiment, a YAG laser for generating a YAG laser beam 80 having a wavelength of 532 nm or 1064 nm. A galvanometer 90 for the second laser 70 is used to scan the YAG laser beam 80 onto the IC package 40 as it passes along its predetermined path.

An exhauster 100 is used to take away flash debris removed by CO$_2$ and YAG laser deflashing. A gas blower 110 is also provided to reduce heating of the IC packages by blowing gas, such as compressed air or N$_2$ gas through a nozzle onto the packages.

Figure 2A:
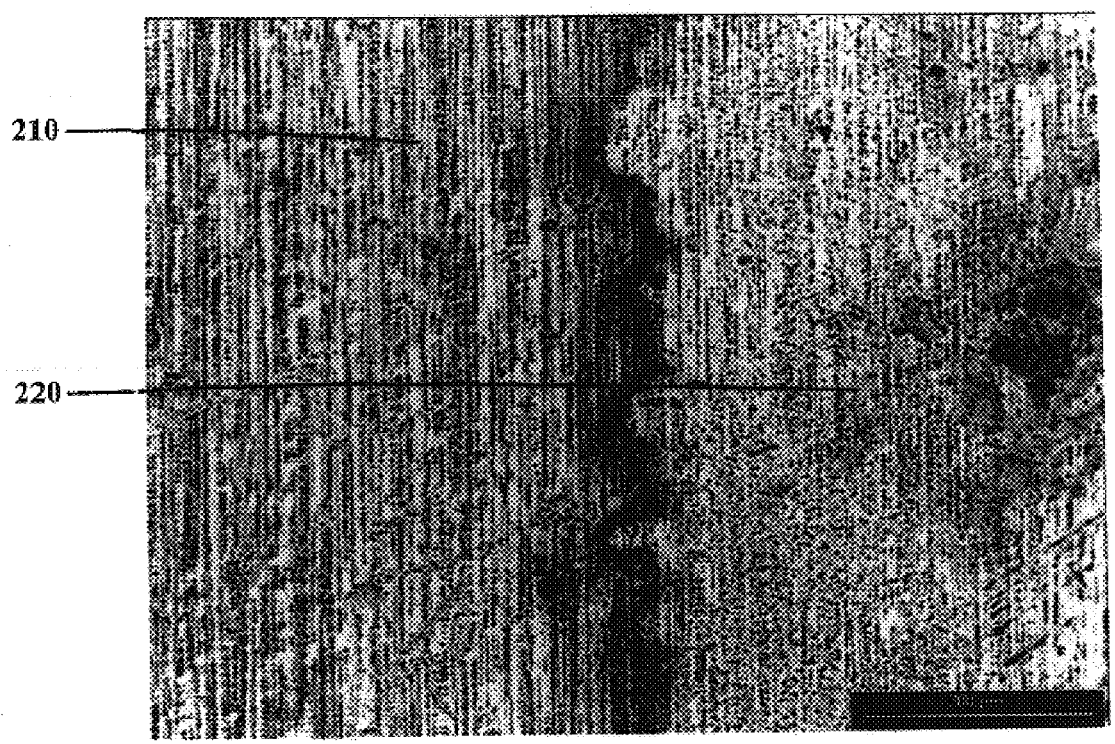
FIG. 2a is a microscope photo showing a sample of heat sink in an IC package deflashed by a prior deflashing method using YAG laser irradiation at 300 mJ/cm$^2$.
Figure 2B:
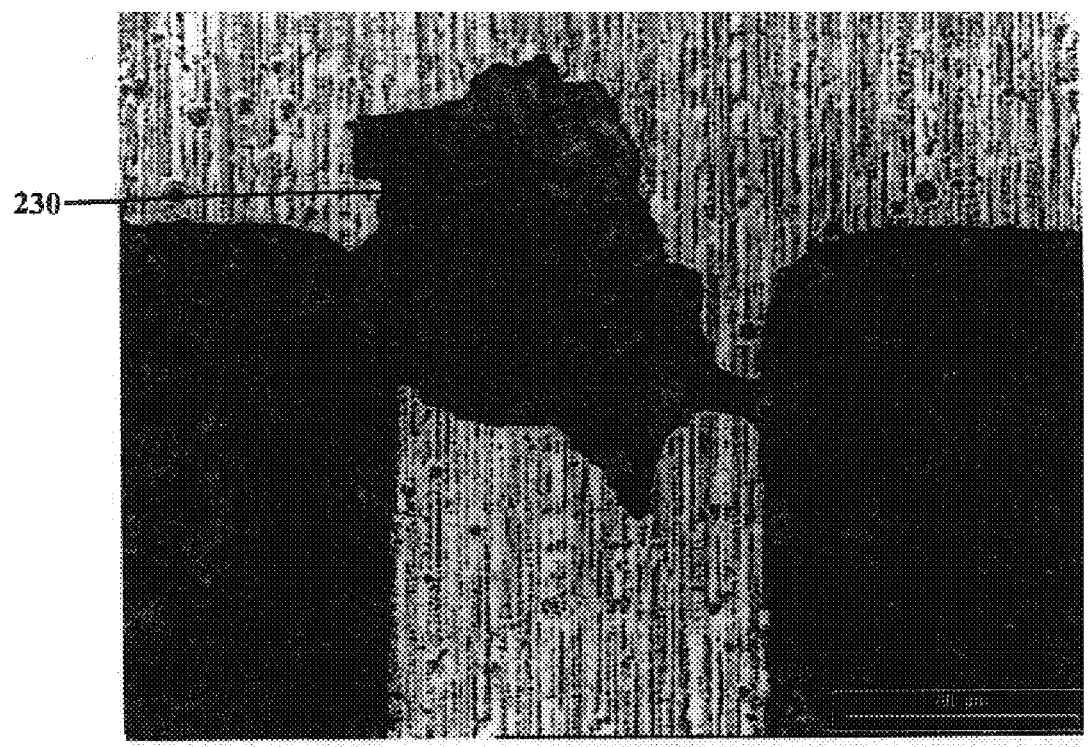
FIG. 2b is a microscope photo showing another part of the same sample deflashed by a prior deflashing method using YAG laser irradiation at 300 mJ/cm$^2$.

As shown in FIGS. 2a and 2b, one sample of heat sink was deflashed according to a prior art laser deflashing method. A YAG laser was used with a wavelength of 532 nm. The pulse duration is 7 ns. The laser fluence was 300 mJ/cm$^2$ and pulse number is 4. At an irradiated area 210, fresh heat sink surface can be seen. A thin layer of flash exists at non-irradiated area 220 as shown in FIG. 2a. This indicates that thin flash can be easily removed by YAG laser deflashing. However, a thick layer of flash at irradiated area 230 in FIG. 2b cannot be removed by YAG laser deflashing at 300 mJ/cm$^2$ and 4 pulses.

Figure 3A:
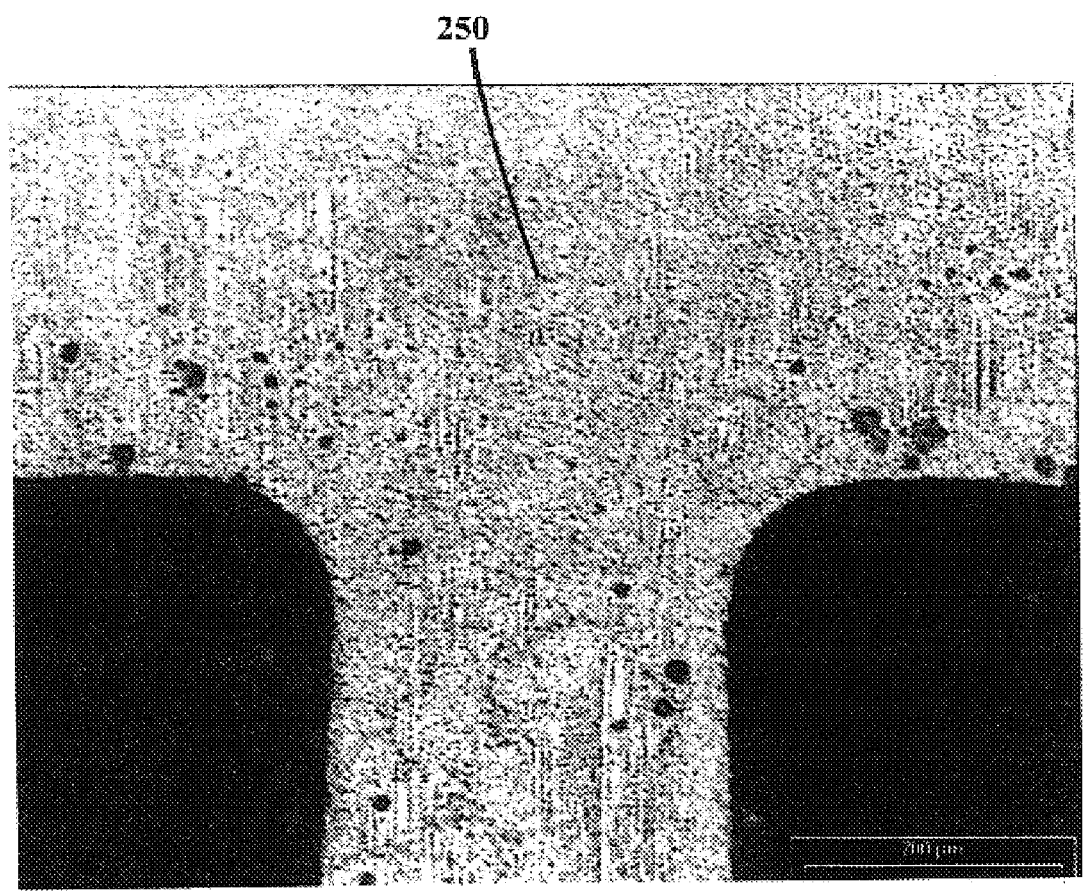
FIG. 3a is a microscope photo showing a sample of heat sink in an IC package deflashed by a prior deflashing method using YAG laser irradiation at 720 mJ/cm$^2$.
Figure 3B:
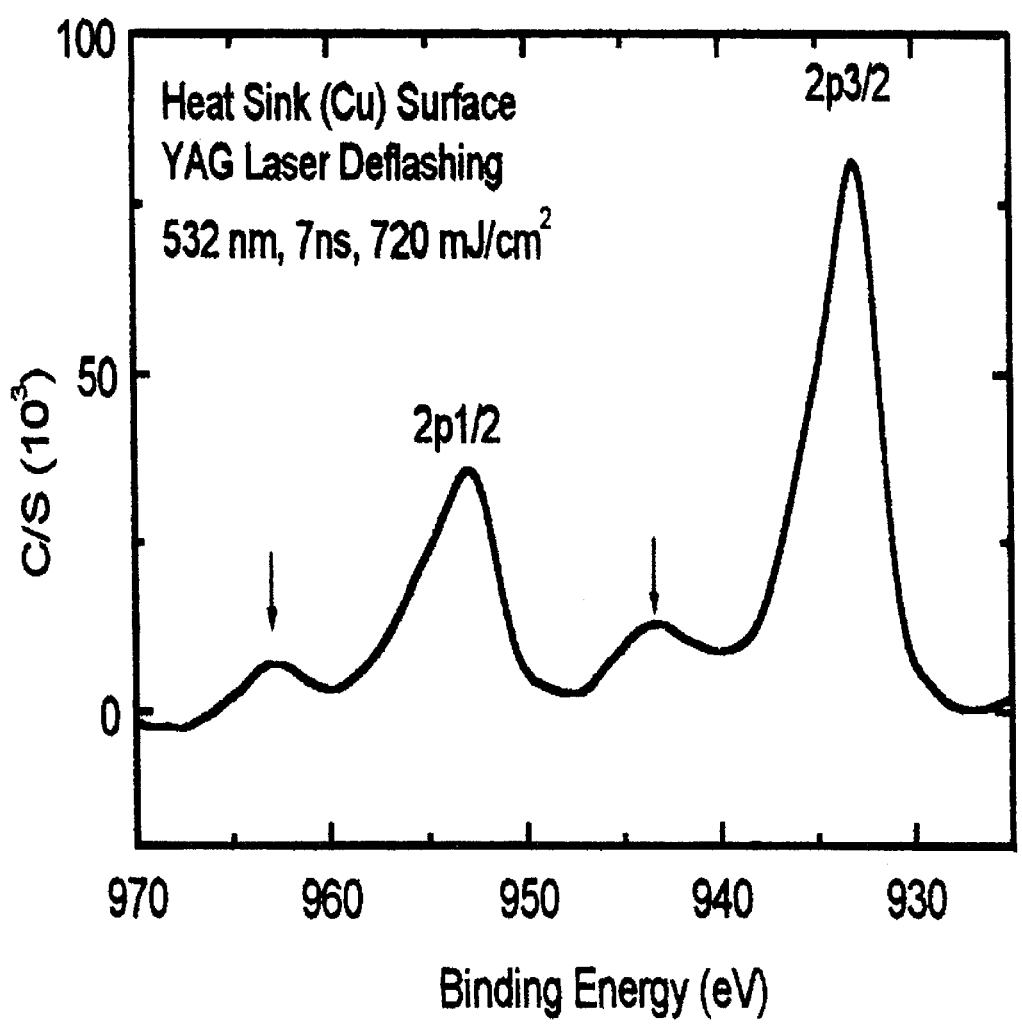

FIG. 3a is a microscope photo showing an sample of heat sink in an IC package deflashed by a prior art deflashing method using YAG laser irradiation at 720 mJ/cm$^2$ and 10 pulses. Although thick flash in area 250 has been removed, damage to the heat sink surface has taken place. FIG. 3b is an X-ray photoelectron spectroscopy (XPS) Cu2p spectrum of the same sample of FIGS. 3a and 3b a after YAG laser deflashing at a wavelength of 532 nm, a laser fluence of 720 mJ/cm$^2$ and a pulse number of 10. Four peaks are observed in the XPS Cu2p spectrum is shown in FIG. 3b. This indicates that damage such as oxidation of heat sink has taken place. Comparing FIGS 2 and 3, we can conclude that a YAG laser can only remove thin flash without damage at low laser fluence and pulse number. A YAG laser cannot remove thick flash without damage. The same effect was observed after deflashing using an excimer laser.

Figure 4A:
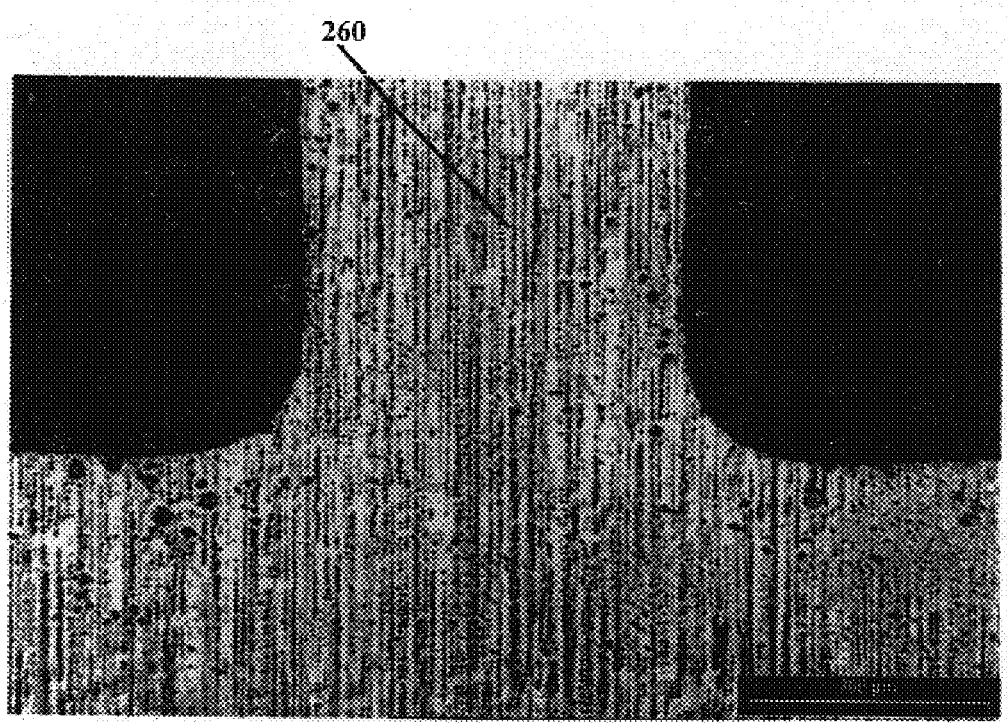
FIG. 4a is a microscope photo showing a sample of heat sink in an IC package deflashed by the method of the present invention using CO$_2$ and YAG laser deflashing.
Figure 4B:
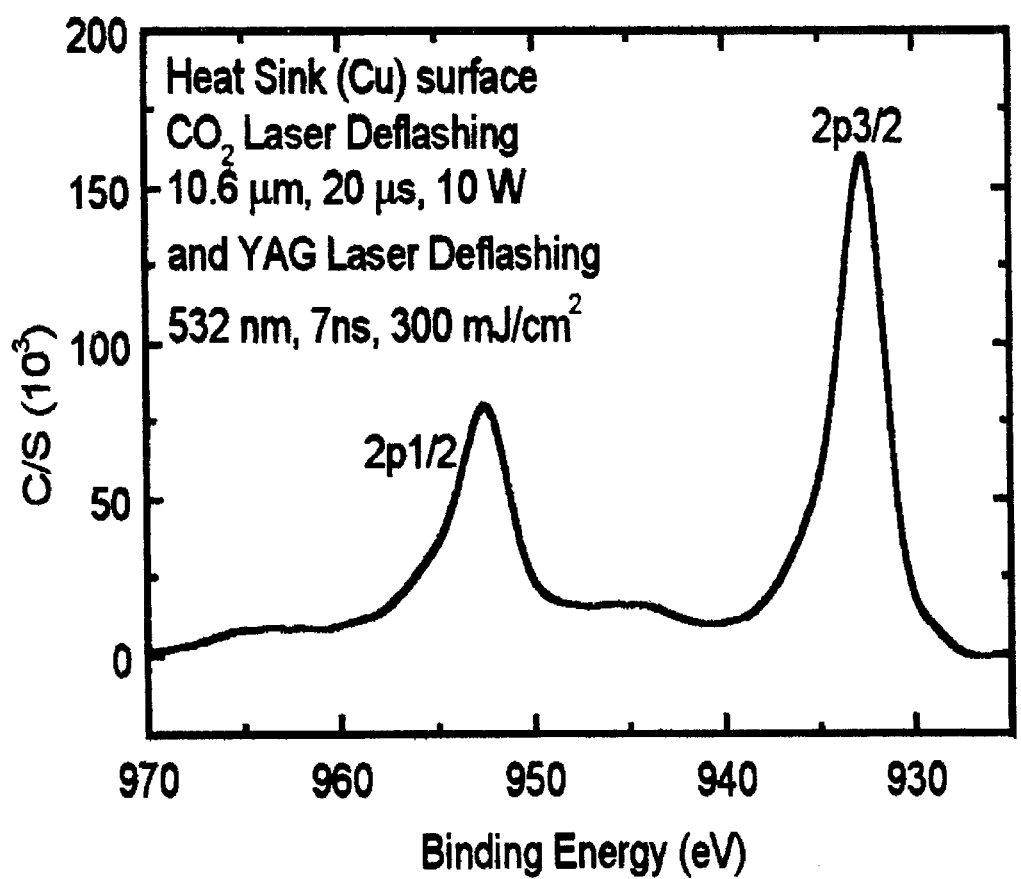

FIG. 4a is a microscope photo showing a sample of heat sink in an IC package deflashed by the method of the present invention in apparatus described with reference to FIG. 1. A first laser deflashing operation was carried out using the first laser 10 at a power of 10 W, pulse duration of 20 $\mu$s, a repetition rate of 2000 Hz and a scan speed of 5 mm/s. Subsequently, a second deflashing operation was performed using a the YAG laser 70 at a wavelength of 532 nm, a laser fluence of 300 mJ/cm$^2$ and a pulse number of 4. As shown in FIG. 4a, flash in area 260 has been removed by the method of the present invention without damage. FIG. 4b is an XPS Cu2p spectrum of the same sample of FIG. 4a. Comparing the XPS Cu2p spectrum of the heat sink with the standard XPS spectra of Cu2p observed in copper, cuprous oxide and cupric oxide, it was found that the XPS Cu2p spectrum of the heat sink is the same as the standard XPS Cu2p spectrum of copper. Therefore, no damage such as oxidation of the heat sink surface has taken place by the deflashing operation embodying the invention.

Figure 5A:
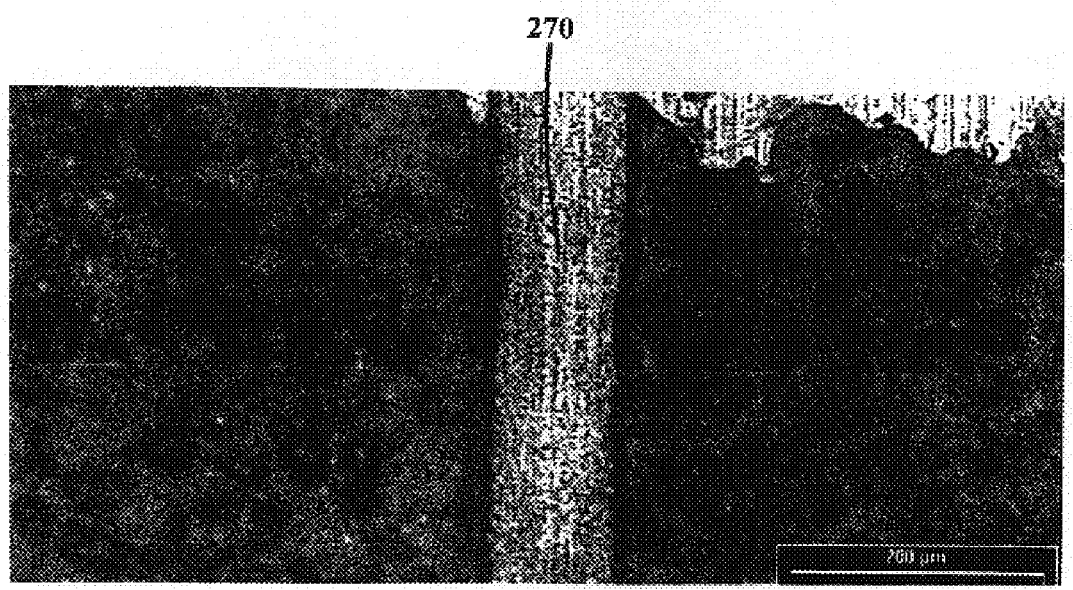
FIG. 5a is a microscope photo showing a sample of heat sink in an IC package deflashed by the method of the present invention using CO$_2$ laser deflashing.
Figure 5B:
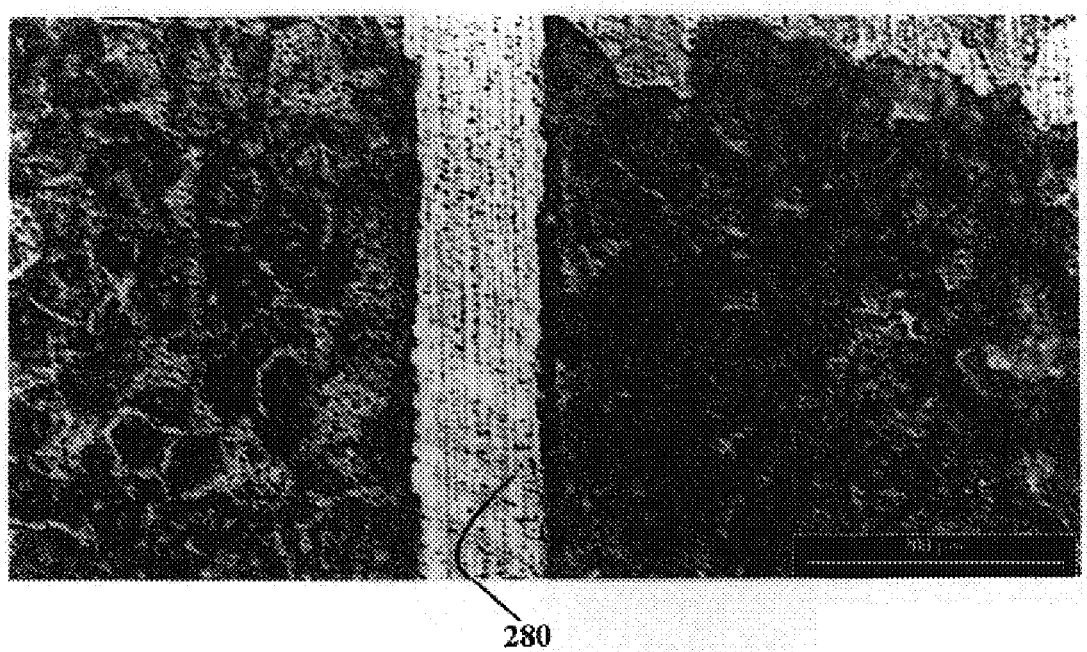
FIG. 5b is a microscope photo showing be same sample of FIG. 5a deflashed by the method of the present invention using YAG laser deflashing.
Figure 5C:
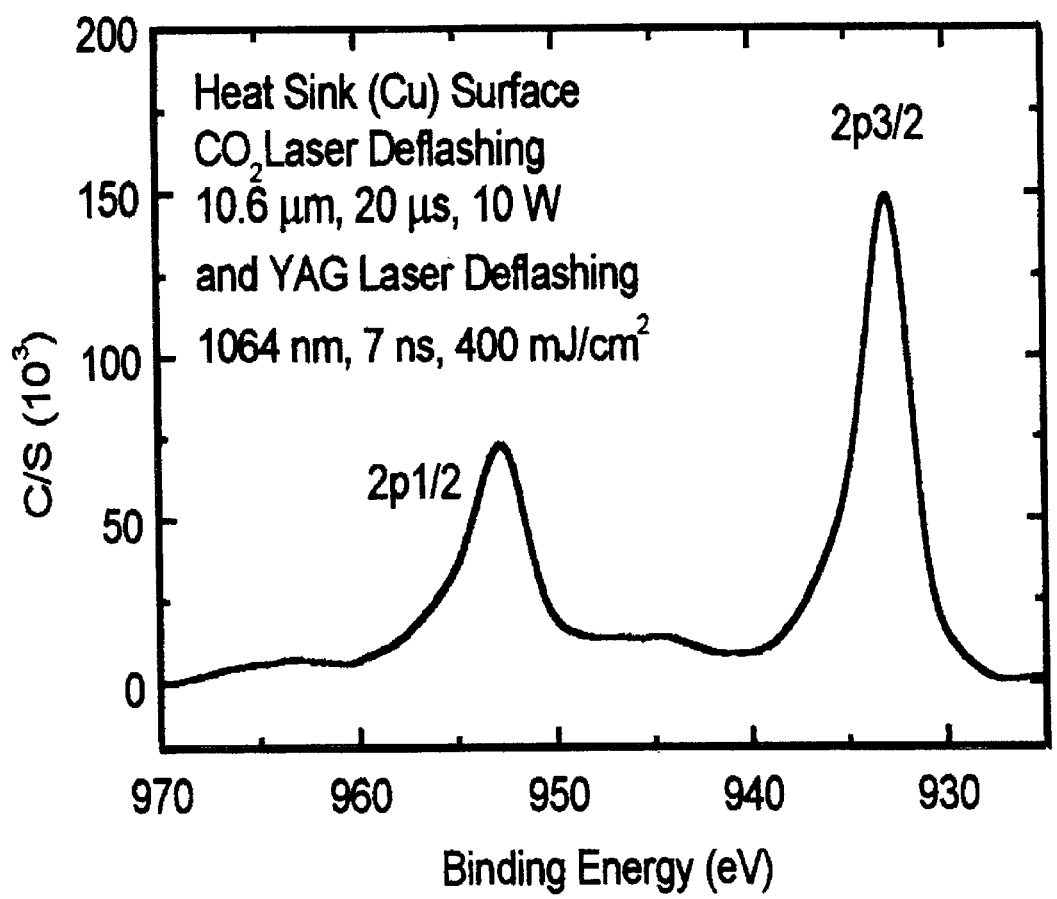
FIG. 5c is an X-ray photoelectron spectroscopy (XPS) Cu2p spectrum of FIG. 5b.

FIG. 5a is a microscope photo showing a sample at heat sink in an IC package deflashed by the method embodying the present invention using CO$_2$ laser deflashing. The heat sink is made of copper. The pulse duration is 20 $\mu$s and the repetition rate is 2000 Hz. The power is 10 W and scan speed is 5 mm/s. It is found that top layer of flash in area 270 has been removed and a thin layer of flash still exists on the heat sink surface. FIG. 5b is a microscope photo showing the same sample of FIG. 5a deflashed by the method of the present invention using YAG laser deflashing. The laser fluence is 400 mJ/cm$^2$ and pulse number is 2. The laser wavelength is 1064 nm and pulse duration is 7 ns. It was observed that the thin flash remained on the heat sink after CO$_2$ laser deflashing has been removed without damage as shown in area 280 of FIG. 5b. FIG. 5c is an XPS Cu2p spectrum of the same sample of FIG. 5b. Comparing the XPS Cu2p spectrum of the heat sink surface with standard XPS spectra of Cu2p observed in copper, cuprous oxide and cupric oxide, it was found that XPS Cu2p spectrum of the heat sink surface is the same with standard XPS Cu2p spectrum of copper. Therefore, no damage such as on oxidation of the heat sink surface has taken place. Therefore, the present invention can be used to effectively remove thin or thick flash without damage.

The present invention may be embodied in other specific forms without departing from the spirit or essential characteristics thereof. The presently disclosed embodiments are therefore, to be considered in all respects as illustrative and not restrictive, the scope of the invention being indicated by the appended claims and all changes which come within the meaning and range of equivalency of the claims are therefore to be embraced therein.

What is claimed is:

1. A method of deflashing IC packages comprising the steps of:

directing a first laser beam in the infra-red frequency range onto flash area for removing top layer of flash; and subsequently directing a second laser beam onto the flash are at low laser fluence and pulse number for removing the thin layer of flash remained after application of the first laser beam, wherein the first laser is operated in pulses of length in excess of 1 μs.

2. A method according to claim 1, wherein the first laser is a $CO_2$ laser.

3. A method according to claim 1 or claim 2 in which the first laser beam has a wavelength of approximately 1064 nm.

4. A method according to claim 1 in which the first laser is operated in continuous wave mode.

5. A method of deflashing IC packages comprising the steps of:

directing a first laser beam in the infra-red frequency range onto flash area for removing top layer of flash; and subsequently directing a second laser beam onto the flash are at low laser fluence and pulse number for removing the thin layer of flash remained after application of the first laser beam, wherein the first laser has an intensity of approximately 10 kw/cm$^2$.

6. A method according to claim 1 in which the second laser is a YAG laser.

7. A method according to claim 6 in which the second laser has a wavelength that is between ultra-violet and infra-red.

8. A method according to claim 7 in which the second laser has a wavelength of approximately 532 nm or 1064 nm.

9. A method according to claim 1 in which the second laser is operated in pulses.

10. A method according to claim 9 in which the pulse duration is between one fs and 1000 ns.

11. A method according to claim 10 in which the pulses are of duration not greater than 100 ns.

12. A method according to claim 1 in which the second laser has a fluence of less than 1000 mJ/cm$^2$.

13. A method according to claim 12 in which the second laser has a fluence of approximately 300 mJ/cm$^2$.

* * * * *

UNITED STATES PATENT AND TRADEMARK OFFICE
CERTIFICATE OF CORRECTION

PATENT NO.        : 6,838,637 B2                                      Page 1 of 1
APPLICATION NO. : 10/059940
DATED             : January 4, 2005
INVENTOR(S)       : Wen Dong Song et al.

It is certified that error appears in the above-identified patent and that said Letters Patent is hereby corrected as shown below:

Title page

The following should be added to the patent and should read -

-- (30)  Foreign Application Priority Data

Oct. 1, 2001  (SG)  ........ 200106032-6---

Signed and Sealed this

Eighth Day of August, 2006

JON W. DUDAS
*Director of the United States Patent and Trademark Office*

UNITED STATES PATENT AND TRADEMARK OFFICE
CERTIFICATE OF CORRECTION

PATENT NO. : 6,838,637 B2
APPLICATION NO. : 10/059940
DATED : January 4, 2005
INVENTOR(S) : Wen Dong Song et al.

It is certified that error appears in the above-identified patent and that said Letters Patent is hereby corrected as shown below:

Title page
The following should be added to the patent and should read —
-- (30)  Foreign Application Priority Data
     Oct. 1, 2001      (SG)     ……..  200106032-6- --

Signed and Sealed this

Twenty-ninth Day of August, 2006

JON W. DUDAS
*Director of the United States Patent and Trademark Office*